United States Patent
Lo et al.

(10) Patent No.: US 8,206,646 B2
(45) Date of Patent: Jun. 26, 2012

(54) METHOD FOR CONSOLIDATING AND DIFFUSION-BONDING POWDER METALLURGY SPUTTERING TARGET

(75) Inventors: Chi-Fung Lo, Fort Lee, NJ (US); Darryl Draper, Congers, NY (US)

(73) Assignee: Praxair Tecnology, Inc., Danbury, CT (US)

( * ) Notice: Subject to any disclaimer, the term of this patent is extended or adjusted under 35 U.S.C. 154(b) by 1097 days.

(21) Appl. No.: 11/644,816

(22) Filed: Dec. 22, 2006

(65) Prior Publication Data

US 2008/0149477 A1    Jun. 26, 2008

(51) Int. Cl.
*B22F 1/00* (2006.01)

(52) U.S. Cl. .................. 419/38; 419/8; 419/25; 419/26; 419/48; 266/274; 204/298.13

(58) Field of Classification Search ............... 419/38
See application file for complete search history.

(56) References Cited

U.S. PATENT DOCUMENTS

| | | |
|---|---|---|
| 5,215,639 A | 6/1993 | Boys |
| 5,230,459 A | 7/1993 | Mueller et al. |
| 5,234,487 A * | 8/1993 | Wickersham et al. ......... 75/248 |
| 5,397,050 A | 3/1995 | Mueller |
| 5,693,203 A | 12/1997 | Ohhashi et al. |
| 5,836,506 A | 11/1998 | Hunt et al. |
| 5,863,398 A | 1/1999 | Kardokus et al. |
| 5,963,778 A | 10/1999 | Stellrecht |
| 6,071,389 A | 6/2000 | Zhang |
| 6,165,413 A * | 12/2000 | Lo et al. .......................... 419/49 |
| 6,299,831 B1 * | 10/2001 | Lo .................................. 419/32 |
| 6,749,103 B1 | 6/2004 | Ivanov et al. |
| 2003/0183518 A1* | 10/2003 | Glocker et al. .......... 204/298.18 |
| 2004/0009087 A1 | 1/2004 | Yi et al. |
| 2004/0222090 A1 | 11/2004 | Scott et al. |
| 2005/0051606 A1* | 3/2005 | Perrot et al. .................. 228/193 |
| 2008/0236738 A1* | 10/2008 | Lo et al. ......................... 156/283 |

FOREIGN PATENT DOCUMENTS

| | | | |
|---|---|---|---|
| JP | 05214518 A | * | 8/1993 |
| JP | 8-325719 | | 12/1996 |
| JP | 2003183822 A | * | 7/2003 |
| WO | 2006/008197 A1 | | 1/2006 |

* cited by examiner

*Primary Examiner* — Roy King
*Assistant Examiner* — Christopher Kessler
(74) *Attorney, Agent, or Firm* — Nilay S. Dalal; Iurie A. Schwartz

(57) ABSTRACT

Methods for manufacturing sputtering target assemblies and assemblies thereof are provided, particularly targets made of powders. Powders are adhered to a backing plate by use of a vacuum hot press, the powder preferably contacted by non-planar surfaces, and is compressed with at least about 95% density and substantially simultaneously diffusion-bonded to the backing plate.

17 Claims, 3 Drawing Sheets

METHOD FOR CONSOLIDATING AND DIFFUSION-BONDING POWDER METALLURGY SPUTTERING TARGET

FIELD OF THE INVENTION

The present invention is generally directed to methods of manufacturing sputtering target assemblies. More specifically, the present invention is directed to the manufacture of sputter target assemblies having non-planar surfaces using powdered layers to facilitate bonding to a back plate.

BACKGROUND OF THE INVENTION

Sputtering is a known means for depositing thin films onto a substrate, such as those especially useful in the manufacture of semi-conductor devices, including integrated circuits. In such known sputtering systems, the material that is deposited onto a substrate is removed from a sputter target by bombarding the target with ions. However, the process imparts thermal energy to the target. In order to prevent the target from overheating, the target is often mounted to a backing plate to dissipate heat. Thus, it is important that a good thermal bond is present between the target and the backing plate.

Since the target and backing plate are often formed from different materials, they often have different rates of thermal expansion, resulting in the target potentially bowing or otherwise becoming dimensionally unstable upon cooling. As a result, such assemblies must undergo a time-consuming flattening and reshaping procedure to orient the target assembly into its desired, planar orientation. Unfortunately, such flattening procedures often introduce torsional, or other stresses on the assembly areas, including the bonding layer between the target and the backing plate, often leading to assembly failure.

Known methods for diffusion-bonding in the manufacture of sputter target assemblies use hot iso-static press (HIP) methods to bond solid target blanks to backing plates with or without bond media. The bond media can be metal foils or interlayer coated on the target or backing plate bond surface by plating, sputtering or other coating techniques.

U.S. Pat. No. 5,397,050 provides a method to use HIP processing to consolidate a W—Ti powder to form a target while bonding the powder composition to the titanium backing plate to form an inter-diffusion type bond between the target and the backing plate. In this art, the powder and the backing plate are placed in a metal can. By applying HIP, the powder is compacted and inter-diffused to the backing plate. After HIP, the assembly is flattened in a separate flattening step by a platen press prior to machining.

U.S. Pat. No. 5,836,506 describes the bonding of a target to a backing plate by controlling the roughness of bond surface between 120 Ra to 150 Ra, and drilling a plurality of holes in one of the bond surfaces. A pressure of 30 MPa (4.35 ksi) to 140 MPa (20 ksi) and 450° C. to 550° C. is applied for targets bonded to Al or Al alloy backing plates, 742° C. to 947° C. for targets bond to Cu or Cu alloy backing plates, 982° C. to 1232° C. for targets bond to steel backing plates or 1182° C. to 1472° C. for targets bond to Ti or Ti alloy backing plates.

U.S. Pat. No. 5,230,459 describes a method for forming a target to a backing plate with a plurality of grooves in one of the bond side by machining, normally the grooves are on the target side. The assembly is heated and pressed under vacuum, inert or reduction environment. When bonding a Ti target to an Al backing plate, bonding is taught as occurring at 550° C. to 625° C. and under 2 ksi to 15 ksi by HIP. For bonding target to Cu backing plate, the bond temperature is taught as being less than the melting point of Cu or Cu alloys.

U.S. Pat. No. 6,749,103 provides a method for bonding a target to a backing plate followed by an annealing at a temperature of from 200° C. to 482° C. A plurality of salient portions, M-shaped ridges or projections are machined into a bond surface, depending on whether the target or backing plate is the harder surface. The projection from the harder metal penetrates into the softer metal by cold pressing at pressures of about 50 tons to 5000 tons. After the low temperature pressure consolidation, the assembly is subjected to 200° C. to 482° C. to ensure adequate adhesion of the pressure consolidated surfaces.

U.S. Pat. No. 5,693,203 describes a bonding method for a target to a backing plate using at least one insert as the bond medium. The insert is made of a soft material such as Al and Al alloys, Cu and Cu alloys, Ag and Ag alloys, or Ni and Ni alloys. The insert thickness is 10 μm or thicker, and can be foil or a sheet and coating film provided by plating, vapor deposition, or sputtering. The target, backing plate and insert are degreased and rinsed with an organic solvent like acetone. The bonding is performed at temperatures of 150° C. to 350° C. and pressure at 1.0-15 kg/mm$^2$ (1.42-21.3 ksi), preferably of 150° C.-250° C. and 3-10 kg/mm$^2$ (4.26-14.2 ksi). The insert is applied when using Al and Al alloys, Cu and Cu alloys, and stainless steels as the backing plates. The targets are bonded at a temperature of 150° C.-550° C. with 1 kg/mm$^2$ minimum. The examples presented disclose that pressure of 7.5 kg/mm$^2$-8 kg/mm$^2$ (10.65-11.36 ksi) is applied for W target and Ti target bonded with Ti backing plate at 500° C.

U.S. Pat. No. 6,071,389 describes a method of diffusion bonding a cobalt target to an aluminum or copper backing plate by means of a titanium interlayer. The Ti interlayer is provided as a foil, but may be also be formed on a mating surface of either the target or the backing plate by electroplating, sputtering, electro-less plating, or plasma spraying. The target may be machined with grooves defining salient points prior to providing the interlayer. The bonding is performed at 600° C. with 100 MPa (14.5 ksi) pressure for three hours. The assembly may be made via vacuum-hot-press, but preferably by hot-isostatic-pressing.

SUMMARY OF THE INVENTION

This invention provides methods for manufacturing a sputtering target assembly, particularly targets comprising powders. Pressing a powder layer to a backing plate by vacuum hot press, the powder layer is consolidated with at least about 95% density and substantially simultaneously diffusion-bonded to the backing plate. Embodiments of the present invention preferably applied to the consolidation temperature of the target material are about equal to or lower than the melting point of the backing plate, such as Cu or Cu alloy target material bonded to Cu, Cu alloy, Ti, stainless steel or Mo backing plate, Ti or Ti alloy target material bonded to Ti or Mo backing plate.

According to additional embodiments, the present invention relates to methods for manufacturing a sputtering target assembly and target assemblies thereof, the assemblies comprising a powder layer provided to a backing plate and pressing the powder layer to the backing plate using a compression means, such as, for example, a vacuum hot press, sufficient to press the powder layer to a density of at least about 95%; while substantially simultaneously diffusion-bonding the powder to the backing plate to achieve a target assembly, and wherein, prior to compression, at least one of the backing plate surfaces and/or the compression means surfaces is non-planar, rendering at least one surface of the powder layer, preferably non-planar prior to compression.

The targets made by the methods of the present invention have at least three times higher bond strength than the conventional solder-bonded products. In addition, the maximum working temperature of the solders used for bonding targets to backings is less than 200° C. The new invention bonds target material directly to backing plate, that allows the working temperature as high as half of the melting point of the target or backing plate. Therefore, much higher sputtering power can be applied, resulting in a higher throughput of film deposition.

In addition, the convex-concave design of the assemblies of the present invention eliminates the flattening process that is conventionally required. This simplifies the manufacturing process and avoids the possibility of cracking the brittle powder targets.

BRIEF DESCRIPTION OF THE DRAWINGS

Other objects, features, embodiments and advantages will occur to those skilled in the art from the following description of preferred embodiments and the accompanying drawings, in which.

DETAILED DESCRIPTION OF THE INVENTION

Figure 1:
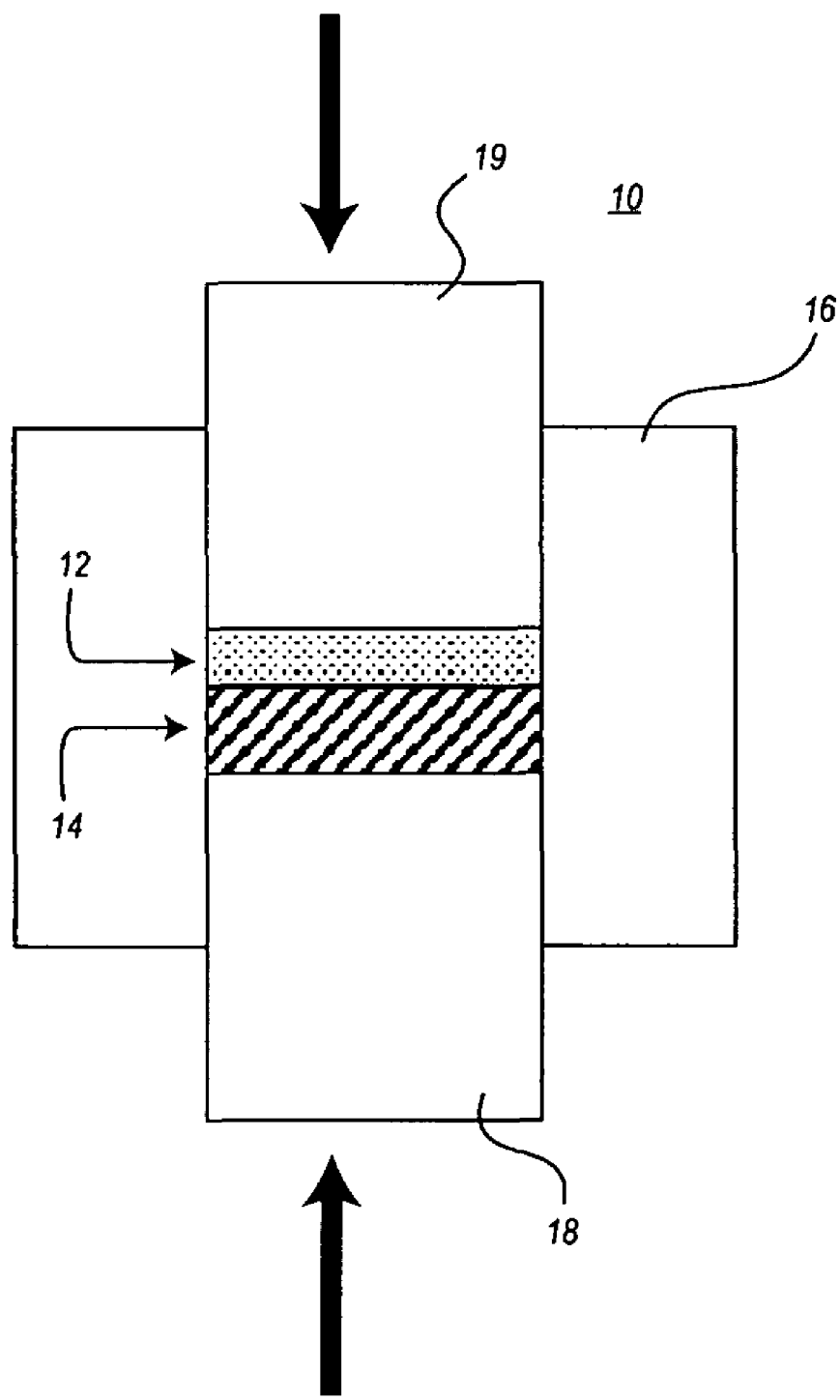
FIG. 1 is a schematic representation of one embodiment of the present invention.

FIG. 1 shows a target manufacturing process and assembly 10 with the powder layer 12 positioned on a planar metal backing plate 14 surrounded by a graphite mold 16 and two flat graphite punches 18, 19 on bottom and top, respectively. By applying a uni-axial compressive stress under an elevated temperature and vacuum or inert gas environment, the powder layer is consolidated and bonded to the metal backing plate. This design may generate warp after the assembly cools down to room temperature due to difference in thermal expansion between target and backing plate.

Figure 2:
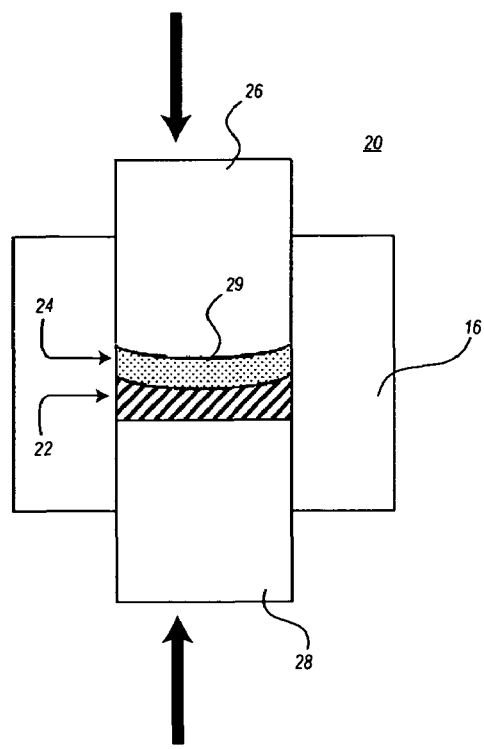
FIG. 2 is a schematic representation of a further embodiment of the present invention.

FIG. 2 shows an embodiment of a target manufacturing process and assembly 20 of the present invention, with the powder layer positioned on a metal backing plate 22 with pre-dished, or concave surface on the side contacting the powder 24. The assembly is surrounded by a graphite mold 16 and two graphite punches 26, 28 on top and at bottom, respectively, with a convex surface 29 on the top punch contacting the powder 24. By applying a uni-axial compressive stress under an elevated temperature and vacuum or inert environment, the powder is consolidated and bonded to the metal backing plate. The creation of a concavity on the backing plate and a convex surface on a punch surface serves to significantly minimize the warp of target. The compressive stress is applied to the target assembly by any suitable compressive means, but is preferably a vacuum-hot-press.

Figure 3:
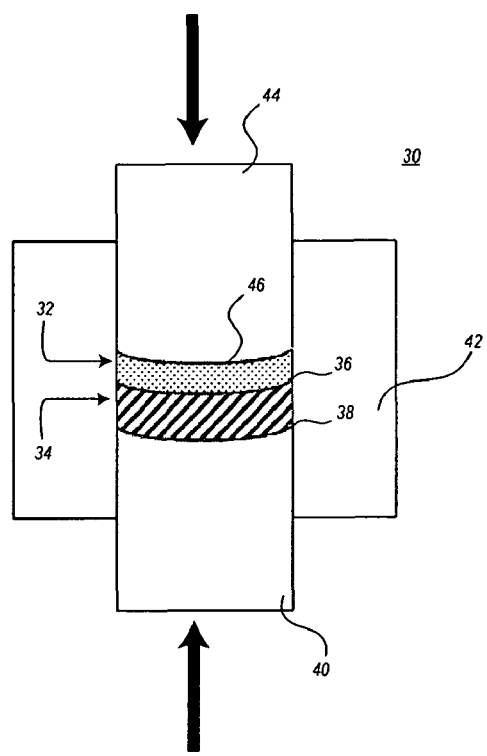
FIG. 3 is a schematic representation of an embodiment of the present invention.

FIG. 3 shows an embodiment of a target manufacturing process and assembly 30 of the present invention, with the powder layer 32 positioned on a metal backing plate 34 having a concave surface 36 on the side contacting the powder layer 32 and convex surface 38 on the side contacting the bottom punch 40. The assembly is surrounded by a graphite mold 42 and two graphite punches 44, 40 on top and bottom, respectively, with a convex surface 46 on the top punch contacting the powder layer 32, and concave surface on the bottom punch 40 contacting the backing plate 34. By applying a uni-axial compressive stress under an elevated temperature and vacuum or inert environment, the powder is consolidated or compressed and bonded to the metal backing plate. This design serves to minimize the warp of the bonded target assembly.

The required radius of the backing plate and/or the top punch, and the concavity (or "convexness") is determined by the coefficient of thermal expansion, mechanical strength, dimension of the target and backing plate, in addition to the bonding temperature. The optimum radius, however, is determined by trial and error, such that an acceptable radius can be obtained.

In one embodiment, the present invention provides an improved method for manufacturing a sputtering target assembly, particularly targets made of powders. By pressing a powder to a backing plate by vacuum hot press, the powder layer is consolidated with at least about 95% density, while effecting substantially simultaneous diffusion-bonding to the backing plate. Embodiments of the present invention are preferably applied to the consolidation temperature of the target material are about equal to or lower than the melting point of the backing plate, such as, for example, Cu or Cu alloy target material bonded to Cu, Cu alloy, Ti, stainless steel or Mo backing plate, Ti or Ti alloy target material bonded to Ti or Mo backing plate, etc. In addition, depending on the thickness ratio between target and backing plate, and the difference in thermal expansion between the target and backing plate, desired shapes (e.g. concave-convex) may be prepared on the backing plate and/or on the punches. The purpose and desirability of a concave-convex design is to minimize the possible warp of the target assembly, especially of the target, after cooling. As discussed herein, the warp is thought to be caused by the difference in thermal expansion between the target and backing plate during cooling of bonding process. According to embodiments of the present invention, by proper design of the concave-convex orientation, during cooling, the assembly is controlled to be warped toward the direction substantially opposite to the concave orientation. Thus, the original concave-convex shape at high temperature becomes substantially planar after cooling to room temperature. As a result, substantial improvement in uniformity of the target thickness is obtained, without an additional, flattening process prior to machining, as is required according to known processes. The backing plate thickness may be thicker that that of the target. As a result, bond assemblies tend to warp toward the backing plate. Therefore, if the concave-convex design is applied to the pressing, it is more likely that the concave surface is on the backing plate and the convex is on the punch facing the powder bed. Elimination of the flattening step, or process, is especially important for the poor ductility target materials, such as, for example, W—Ti alloys, etc.

Embodiments of the present invention provide a layer made from consolidated, or compressed powder to form a target blank with a density of at least about 95% of the theoretical density, while substantially simultaneously, diffusion bonding the powder to the backing plate. In contrast to known processes, according to embodiments of the present invention, a two-in-one process is provided and performed, preferably by vacuum-hot-pressing. Compared to the known methods using HIP, embodiments of the present invention not only reduce the manufacturing processing time but also greatly reduce the manufacturing cost. In addition, a concave-convex design, existing on the backing plate and the graphite punch, reduces warp of the bond assembly, and especially of the finished target blank, after cooling. These preferred designs serve to eliminate the otherwise required, conventional flattening processes of the bond assembly. Additionally, minimizing warp of the target assembly provides a significantly improved uniformity of the target thickness, without flattening, prior to machining, leading to greater finished product uniformity.

Further, embodiments of the present invention have significant advantages over known methods. For example, it has now been determined that use of a vacuum-hot-press (VHP) provides lower cost and shorter lead-time as opposed to hot-iso-static-press (HIP) processes. Using the VHP methods of the present invention, the powder and backing plate are pressed in a vacuum chamber under uni-axial pressure. By comparison, using HIP processes, the powder and backing plate need to be capsulized in a metal can followed by evacuation and sealing prior to being pressed in a vessel under high pressure Ar gas.

Therefore, according to embodiments of the present invention, the concave-convex designs on the punch and backing plate surfaces facing the powder bed minimize warp of the bond assembly, as a result of eliminating the flattening process, and serves to avoid the possibility of finished assembly failure due to cracking or other damage, for example, of the poor ductility W—Ti and other targets during flattening. The improved manufacturing processes of the present invention yield greater assembly uniformity without sacrificing desired and required target assembly properties.

Embodiments of the present invention are suitably applied to many sputtering target bond assemblies by vacuum hot pressing. For example, processes of the present invention preferably may be used with mixed powder of Ti—W diffusion bonded to Ti at temperatures of from about 1100° C. to about 1400° C., preferably from about 1200° C. to about 1300° C. and most preferably about 1250° C. Mixed powder of Cu—Cr diffusion bonds to Cu backing plate at temperatures of from about 900° C. to about 1050° C., preferably from about 950° C. to about 1010° C. and most preferably about 1000° C. Preferred powder size is less than about 150 µm and greater than about 40 µm, more preferably from about 100 µm to about 40 µm. Additionally, the processes of the present invention optionally roughen the bond surface of the backing plate from about 100 µin to about 300 µin, and preferably about 200 µin Ra by grit, as embodiments of the present invention contemplate blasting or other surface roughening methods. Pressing pressures of from about 0.5 ksi to about 6.0 ksi are preferred, more preferably from about 1.0 ksi to about 6.0 ksi, and most preferably about 2 ksi, using a preferred holding time of from about 1 hour to about 8 hours, more preferably from about 2 hours to about 8 hours, and most preferably about 5 hours, under a vacuum of about 10E-5 Torr.

Non-limiting preferred embodiments of the present invention are presented in the following Examples, which are provided for illustrative purposes only.

EXAMPLES

Example 1

Figure 4:
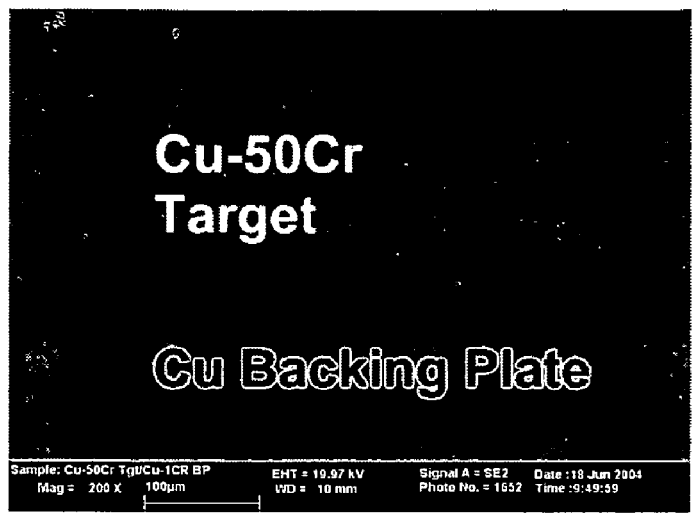
FIG. 4 is a cross-sectional micro-photograph showing a sputtering target assembly of the present invention.

A 4 inch diameter×0.5 inch thick Cu blank was grit-blasted at one surface by SiC to generate 200 µin Ra roughness prior to being placed into a 4 inch diameter graphite mold with the grit-blasted surface facing upward. An amount of about 400 grams Cu-50 wt % Cr mixed powder is placed on the top of the Cu blank and pressed at 2 ksi and 1000° C. under 10E-5 Torr vacuum for 5 hours. The pressed assembly showed that 100% bond and 96% target density were achieved. A tensile test as described in U.S. Pat. No. 6,092,427 (and incorporated by reference herein as if made a part of the present disclosure) was used, and the test piece was fractured at the target side at 980 pounds of pressure. At that stage no separation was observed at the bond interface. By applying the same aforementioned tensile test method to the conventional In-30Sn solder-bonded Cu-50% Cr target/Cu backing plate, only 320 pounds was required to separate the In/30Sn solder-bonded Cu-50% Cr target/Cu backing plate bond assembly at the bond interface. FIG. 4 is a cross-sectional micro-photograph showing a target assembly of the present invention having a Cu-50 wt % Cr diffusion bond to Cu backing plate sample which was made by pressing the 50 wt % Cu/50 wt % Cr mixed powder to a Cu blank at 1000° C./2 ksi for 5 hours.

Example 2

Figure 5:
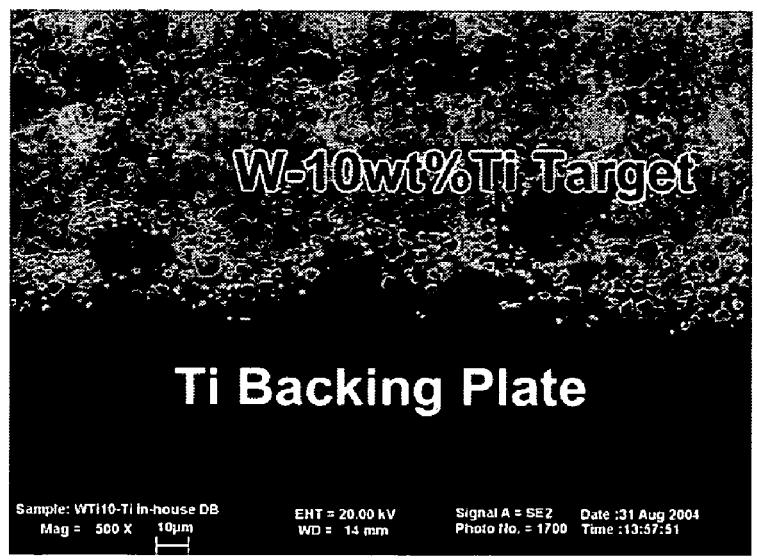
FIG. 5 is a cross-sectional micro-photograph showing a sputtering target assembly of the present invention.

A 4 inch diameter×0.5 inch thick commercial Ti blank was grit-blasted at one surface by SiC to generate 150 µin Ra roughness prior to being placed into a 4 inch diameter graphite mold with the grit-blasted surface facing upward. An amount of about 740 grams W-10 wt % Ti mixed powder was loaded on the top of the Ti blank and pressed at 2 ksi and 1250° C. under 10E-5 Torr vacuum for 5 hours. The pressed assembly showed that 100% bond and 100% target density were achieved. Using the testing method disclosed above in Example 1, the test piece was fractured at the target side at 800 pounds. At that stage, no separation was observed at the bond interface. By applying the same tensile test method to the conventional In-30Sn solder-bonded W-10% Ti target/Ti backing plate, only 320 pounds was required to separate the In/30Sn solder-bonded W-10% Ti target/Cu backing plate bond assembly at the bond interface. FIG. 5 is a cross-sectional micro-photograph showing a target assembly of the present invention having a W-10 wt % Ti diffusion bond to Ti backing plate by pressing is shown. The 90 wt % W/10 wt % Ti mixed powder is pressed to a Ti blank at 1250° C./2 ksi for 5 hours.

Example 3

An 18 inch diameter×0.5 inch thick commercial Ti blank was machined on the bond surface to have radius prior to being grit-blasted by SiC to generate 150 µin Ra roughness. This blank was then placed to an 18 inch diameter graphite mold with the dished surface facing up. An amount of about 25,000 grams of W-10 wt % Ti mixed powder was loaded on the top of the Ti blank and pressing at 2 ksi and 1250° C. under 10E-5 Torr vacuum for 5 hours. The pressed assembly showed that 100% bond and 100% target density were achieved. In addition, comparing to the known pressed assembly with greater than 0.1 inch warp by flat pressing, warp of the bond assembly using the concave design was less than 0.03 inch. Therefore, no flattening is required prior to machining to the final dimension of sputtering target.

Embodiments of the present invention are suitable to be applied to the following sputtering target bond assemblies by vacuum hot pressing. The following conditions are particularly preferred in use with the following compound combinations, including the use of mixed powders of Ti—X (Ti—W, Ti—Cu, Ti—Fe, Ti—Ni, Ti—Al, etc.) for the target materials in combination with Ti or Mo backing plates subjected to a temperature range of from about 1100° C. to about 1300° C.

Alternate preferred conditions and compound combinations include mixed powders of Cu—X (Cu—Cr, Cu—Ti, Cu—Ni, and combinations thereof, etc.) as target materials, and backing plates made from Cu, Cu alloys, stainless steel, Ti, Mo, and combinations thereof, at pressing temperatures in the range of from about 900° C. to about 1050° C. Additionally, Ru powder may be used as the target material with Mo or W used as the backing plate, with a processing temperature range of from about 1700° C. to about 2000° C.

Preferred powder size is less than about 100 μm and greater than about 40 μm. The bond surface of the backing plate is optionally roughened with a means having a grit range of from about 100μ to about 300μ Ra by grit, and it is understood that blasting or other surface roughening methods may be employed, with preferred minimum pressing pressure of about 0.5 ksi minimum, at preferred minimum holding time of about 3 hours at a minimum preferred vacuum of about 10E-4 Torr.

While the invention has been described in detail with reference to specific embodiments thereof, it will be apparent to one skilled in the field that various changes, modifications and substitutions can be made, and equivalents employed without departing from, and are intended to be included within, the scope of the claims.

We claim:

1. A method for manufacturing a sputtering target assembly comprising the steps of:
   providing a powder layer having a first and second surface;
   providing a backing plate having a first and second surface;
   providing a compression means having an upper portion surface and a lower portion surface;
   positioning the first surface of the backing plate against the lower portion surface of the compression means;
   positioning the first surface of the powder layer against the second surface of the backing plate;
   positioning the upper portion surface of the compression means against the second surface of the powder layer to a non-planar orientation, wherein the surface of the upper portion of the compression means is convex;
   compressing the powder and backing plate to press the powder to a density of at least about 95%;
   diffusion-bonding the powder to the backing plate to achieve a target assembly; and
   controlling the target assembly to be warped toward a direction opposite to the second surface of the backing plate during cooling, whereby the target assembly attains a planar orientation.

2. The method of claim 1, wherein the powder comprises a material selected from a group consisting of copper-containing material and titanium-containing material.

3. The method of claim 1, wherein the powder comprises copper.

4. The method of claim 3, wherein the copper is a copper alloy selected from the group consisting of: copper-chromium; copper-titanium; copper-nickel, and combinations thereof.

5. The method of claim 1, wherein the powder comprises titanium.

6. The method of claim 2, wherein the backing plate is made from a material selected from the group consisting of: copper, copper alloys, stainless steel, titanium, molybdenum, tungsten, and combinations thereof.

7. The method of claim 1, wherein the powder layer comprises a powder size from about 40 μm to about 150 μm.

8. The method of claim 1, further comprising a state of altering the surface area of at least one surface of the backing plate.

9. The method of claim 8, wherein the at least one surface of the backing plate is roughened with a means having a grit measure of from about 100 μin to about 300 μin Ra.

10. The method of claim 1, wherein a pressure of from about 0.5 ksi to about 6.0 ksi is applied to the powder and backing plate.

11. The method of claim 10, wherein pressure is applied at a holding time of from about 1 hour to about 8 hours.

12. The method of claim 3, wherein the compression means comprises a hot vacuum press that is maintained at a processing temperature of from about 900° C. to about 1050° C. for copper.

13. The method of claim 5, wherein compression means comprises a hot vacuum press that is maintained at a processing temperature of from about 1100° C. to about 1400° C. for titanium.

14. The method of claim 1, wherein at least one of the surfaces selected from the group consisting of: the first surface of the backing plate; the second surface of the backing plate; the surface of the lower portion of the compression means, are non-planar.

15. The method of claim 1, wherein the compression means is a vacuum hot press.

16. A method for manufacturing a sputtering target assembly comprising the steps of:
   providing a powder layer having a first and second surface;
   providing a backing plate having a first and second surface;
   providing a compression means having an upper portion surface and a lower portion surface;
   positioning the first surface of the backing plate against the lower portion surface of the compression means;
   positioning the first surface of the powder layer against the second surface of the backing plate;
   positioning the upper portion surface of the compression means against the second surface of the powder layer to a non-planar orientation;
   compressing the arrangement to press the powder to a density of at least about 95%;
   diffusion-bonding the powder to the backing plate to achieve a target assembly; and wherein the surface of the upper portion of the compression means is convex and the second surface of the backing plate is concave; and
   controlling the target assembly to be warped toward a direction opposite to the second surface of the backing plate during cooling, whereby the target assembly attains a planar orientation.

17. The method of claim 5, wherein the titanium is a titanium alloy selected from the group of consisting of titanium-tungsten; titanium-copper; titanium-iron; titanium-nickel; titanium-aluminum; and combinations thereof.

* * * * *